US009773958B2

(12) United States Patent
Chan et al.

(10) Patent No.: US 9,773,958 B2
(45) Date of Patent: Sep. 26, 2017

(54) OPTICAL SOLID STATE PREPOLYMER AND MOLDING COMPOSITION

(71) Applicant: INDUSTRIAL TECHNOLOGY RESEARCH INSTITUTE, Chutung, Hsinchu (TW)

(72) Inventors: Ying-Nan Chan, Erlin Township (TW); Shu-Chen Huang, Keelung (TW); Chih-Hao Lin, Taoyuan (TW); Wen-Bin Chen, Tainan (TW); Kai-Chi Chen, Tsautuen Jen (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 15/015,818

(22) Filed: Feb. 4, 2016

(65) Prior Publication Data
US 2017/0179349 A1 Jun. 22, 2017

(30) Foreign Application Priority Data
Dec. 17, 2015 (TW) .............................. 104142431 A

(51) Int. Cl.
*H01L 33/56* (2010.01)
*C08L 83/04* (2006.01)
*C08J 5/00* (2006.01)

(52) U.S. Cl.
CPC ................ *H01L 33/56* (2013.01); *C08J 5/00* (2013.01); *C08L 83/04* (2013.01); *C08J 2383/04* (2013.01); *C08J 2483/04* (2013.01)

(58) Field of Classification Search
CPC .............. H01L 33/56; C08J 5/00; C08L 83/04
USPC ....................................................... 523/435
See application file for complete search history.

(56) References Cited

U.S. PATENT DOCUMENTS

| 6,867,323 | B2 | 3/2005 | Denmark et al. |
| 6,933,345 | B1 | 8/2005 | Lichtenhan et al. |
| 7,553,904 | B2 | 6/2009 | Lichtenhan et al. |
| 8,013,039 | B2 | 9/2011 | Hsu et al. |
| 8,440,774 | B2 | 5/2013 | Lin et al. |
| 8,604,150 | B2 | 12/2013 | Morinaka et al. |
| 8,721,919 | B2 | 5/2014 | Huang et al. |

| 2002/0183516 | A1 | 12/2002 | Denmark et al. |
| 2010/0140638 | A1 | 6/2010 | Kotani et al. |
| 2010/0155739 | A1 | 6/2010 | Kuramoto et al. |
| 2011/0054072 | A1 | 3/2011 | Sawada et al. |
| 2012/0041170 | A1 | 2/2012 | Benes et al. |
| 2013/0144026 | A1 | 6/2013 | Su et al. |
| 2013/0158165 | A1 | 6/2013 | Han et al. |
| 2015/0197631 | A1 | 7/2015 | Chan et al. |

FOREIGN PATENT DOCUMENTS

| CN | 102815071 | * | 12/2012 |
| TW | I325898 A | | 11/1995 |
| TW | 201324056 A | | 6/2013 |
| TW | 201350524 A | | 12/2013 |
| TW | 201527434 A | | 7/2015 |

OTHER PUBLICATIONS

Lu et al., "High refractive index organic-inorganic nanocomposites: design, synthesis and application", Journal of Materials Chemistry, 2009, 19, pp. 2884-2901.
Mori et al., "Silsesquioxane-Based Nanoparticles Formed via Hydrolytic Condensation of Organotriethoxysilane Containing Hydroxy Groups", Macromolecules, 2004, 37, pp. 5228-5238.
Nishikubo et al., "A Novel Polyaddition of Bis(epoxide)s with Triazine Diaryl Ether for the Synthesis of Poly(ether)s Containing Triazine Group in the Main Chain", Journal of Polumer Science: Part A: Polymer Chemistry, 2000, 38, pp. 3604-3611.
Wen et al., "Organic/Inorganic Hybrid Network Materials by the Sol-Gel Approach", Chem. Mater., 1996, 8, pp. 1667-1681.
Zeng et al., "Free volume hole size of Cyanate ester resin/Epoxy resin interpenetrating networks and its correlations with physical properties", Radiation Physics and Chemistry, 2010, 79, pp. 966-975.
Huang et al., "Preparation and Characterization of Epoxy/Polyhedral Oligomeric Silsesquioxane Hybrid Nanocomposites," Journal of Polymer Science: Part B: Polymer Physics, vol. 47, 2009, pp. 1927-1934.
Taiwanese Office Action and Taiwanese Search Report, dated Oct. 6, 2016, for Taiwanese Application No. 104142431.

* cited by examiner

*Primary Examiner* — Deve E Valdez
(74) *Attorney, Agent, or Firm* — Birch, Stewart, Kolasch & Birch, LLP

(57) ABSTRACT

An optical solid state prepolymer is provided, which includes a product formed by reacting 100 parts by weight of (a) epoxy resin and 0.1 to 30 parts by weight of (b) oligomeric silsesquioxane. The (a) epoxy resin includes (a1) linear siloxane epoxy resin and (a2) cyclic siloxane epoxy resin with a weight ratio of 1:1 to 5:1.

11 Claims, No Drawings

OPTICAL SOLID STATE PREPOLYMER AND MOLDING COMPOSITION

CROSS REFERENCE TO RELATED APPLICATIONS

The present application is based on, and claims priority from, Taiwan Application Serial Number 104142431, filed on Dec. 17, 2015, the disclosure of which is hereby incorporated by reference herein in its entirety

TECHNICAL FIELD

The technical field relates to a molding composition, and in particular it relates to a composition of an optical solid state prepolymer contained in the molding composition.

BACKGROUND

Light-emitting diodes (LED) have such advantages as being power-saving, producing little pollution, and having a small volume, a long life-time (hundred thousand hours), a fast response time, a high reliability, and a large module flexibility. As a result, LEDs are widely applied in technical fields. With the currently progress being made in technological developments, the efficiency and brightness of LEDs are continuously being enhanced, so that the range of possible applications is large enough to cover applications such as the backlight module of a display and the light source in a vehicle. In the near future, it will be possible for LEDs to replace fluorescent lamps, becoming the next-generation light source. Furthermore, LEDs with high power and high brightness are becoming the mainstream of future development, and the demands upon them are gradually increasing. Conventional thermosetting epoxy molding compounds (EMC) are mainly utilized in semiconductor IC packaging, such as packaging, protecting, and encapsulating chip circuits and lead pins in the front end-of-line and related materials to avoid external damage and influence from the outside environment. Almost all of the epoxy resins and curing agents of the EMC are multifunctional solid materials, which are ground and dry-mixed, and then blended with a large quantity of inorganic powders by using blending equipment (e.g. bi-axial blender). As such, a thermosetting and transfer molding resin composition (e.g. EMC) with a uniform dispersion, tunable process flowability, and fast cure molding is obtained. However, these resin and curing agent materials are opaque, and as such that they are limited to applications in semiconductor IC packaging, and cannot be used in an optical application requiring transparency, such as in LED white reflective EMC material.

The conventional LED backlight module and LED package device for general illumination have been developed to meet such requirements as high brightness and high power. A thermoplastic resin polyphthalamide (PPA) of a reflective cup for conventional PLCC LEDs cannot be applied in high-power PLCC LEDs due to its low photo thermal resistance and easy yellowing. In recent years, the thermoplastic material also includes a novel injection molding material PCT (polyester type), but it still fails to efficiently improve upon the thermoplastic material properties of low photo thermal resistance and easy yellowing.

Accordingly, a thermosetting EMC white reflective material with a higher thermal and photo resistance is called for to meet the material requirements (photo and thermal stability) of high-power LED devices to improve the reliability of the LED package device.

SUMMARY

One embodiment of the disclosure provides an optical solid state prepolymer, comprising: a product formed by reacting 100 parts by weight of (a) epoxy resin and 0.1 to 30 parts by weight of (b) oligomeric silsesquioxane, wherein the (a) epoxy resin includes (a1) linear siloxane epoxy resin and (a2) cyclic siloxane epoxy resin, and the (a1) linear siloxane epoxy resin and (a2) cyclic siloxane epoxy resin have a weight ratio of 1:1 to 5:1.

One embodiment of the disclosure provides a molding composition, comprising: 10 to 50 parts by weight of the described optical solid state prepolymer; 3 to 15 parts by weight of a non-aromatic anhydride of solid state; and 30 to 85 parts by weight of a white pigment and an inorganic filler, wherein the white pigment and the inorganic filler have a weight ratio of 1:2 to 1:10.

A detailed description is given in the following embodiments.

DETAILED DESCRIPTION

In the following detailed description, for the purposes of explanation, numerous specific details are set forth in order to provide a thorough understanding of the disclosed embodiments. It will be apparent, however, that one or more embodiments may be practiced without these specific details.

In one embodiment, an optical solid state prepolymer includes a product formed by reacting 100 parts by weight of (a) epoxy resin and 0.1 to 30 parts by weight of (b) oligomeric silsesquioxane. A higher ratio of the (b) oligomeric silsesquioxane may enhance the reactivity of the composition, and has a faster reaction rate with the (a) epoxy resin. Too low ratio of the (b) oligomeric silsesquioxane cannot form a solid state prepolymer even if the reaction temperature is over 150° C. Too high ratio of the (b) oligomeric silsesquioxane results in a fast curing reaction at room temperature, thereby negatively influencing the processability of the optical prepolymer and the processability and reactivity of the composition formulation in following steps. Compared to a conventional anhydride curing agent in transparent epoxy resin system, the (b) oligomeric silsesquioxane and the (a) epoxy resin have a lower reaction temperature.

The (a) epoxy resin includes (a1) linear siloxane epoxy resin and (a2) cyclic siloxane epoxy resin, and the (a1) linear siloxane epoxy resin and (a2) cyclic siloxane epoxy resin have a weight ratio of 1:1 to 5:1. Too little (a2) cyclic siloxane epoxy resin makes the cured product of a transfer molding process be overly soft, which cannot uniformly fill the mold (or adhering to the mold during demolding). Too much (a2) cyclic siloxane epoxy resin makes the cured product of the transfer molding process be overly brittle.

In one embodiment, the (a1) linear siloxane epoxy resin has a chemical structure as shown in Formula 1.

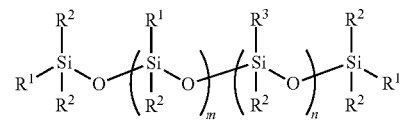

(Formula 1)

The (a1) linear siloxane epoxy resin has at least two epoxy groups. The epoxy group can be introduced by hydrosilylation through molecular structure design, such that the weight average molecular weight of the (a1) linear siloxane epoxy resin can be controlled to be 500 to 15000. An overly low Mw of the (a1) linear siloxane epoxy resin may cause insufficient mechanical strength and thermal resistance of the product. An overly high Mw of the (a1) linear siloxane epoxy resin may make the product be difficult to process. In Formula 1, m and n have a ratio of 1:10 to 3:1. The prepolymer may have a suitable crosslink density with an appropriate m/n ratio, which may improve the insufficient mechanical strength of a conventional EMC reflective material. In Formula 1, $R^1$ is a $C_{1-6}$ alkyl group or an epoxy group, $R^2$ is a $C_{1-6}$ alkyl group, and $R^3$ is an epoxy group.

In one embodiment, the (a2) cyclic siloxane epoxy resin has a chemical structure as shown in Formula 2.

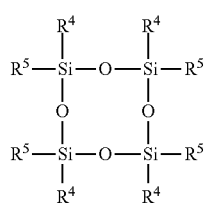

(Formula 2)

The (a2) cyclic siloxane epoxy resin has a molecular weight of 700 to 1100. An overly low molecular weight of the (a2) cyclic siloxane epoxy resin makes the product have an insufficient rigidity. An overly low molecular weight of the (a2) cyclic siloxane epoxy resin makes the product be easily brittle. In Formula 2, $R^4$ is a $C_{1-6}$ alkyl group, and $R^5$ is an epoxy group.

Because the (a) epoxy resin and the (b) oligomeric silsesquioxane contain a lot of siloxane structures, such that the total bonding energy of the composition is increased. As such, the composition has excellent UV and high temperature stabilities.

In one embodiment, the (b) oligomeric silsesquioxane has a chemical structure of $R^6{}_3SiO_{1/2})_a(R^7{}_2SiO_{2/2})_b(R^8SiO_{3/2})_c(SiO_{4/2})_d(HO_{1/2})_e$ with a weight average molecular weight of 600 to 6000. If (b) oligomeric silsesquioxane has an overly low Mw, a solid state prepolymer at room temperature cannot be formed. If (b) oligomeric silsesquioxane has an overly high Mw, the prepolymer cannot have a sufficient flowability during processing at 80° C. to 120° C. $R^6$ is a $C_{1-8}$ alkyl group or a hydroxyl group. Each of $R^7$ and $R^8$ is independently of a $C_{1-8}$ alkyl group. a is 0 to 10, b is 0 to 12, c is 0 to 12, d is 0 to 10, and e is 3 to 18.

In one embodiment, the (b) oligomeric silsesquioxane has a chemical structure of Formula 3.

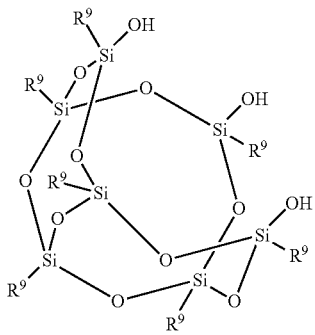

(Formula 3)

In Formula 3, $R^9$ is an alkyl group.

The optical solid state prepolymer has a multi-siloxane structure to improve its photo and thermal resistance. The optical solid state prepolymer has a tunable flowability during processing. For example, the optical solid state prepolymer is a non-flowable solid at 50° C., and has a melting viscosity of 100 to 10000 mPa·s and reactivity at 80° C. to 120° C. Furthermore, the optical solid state prepolymer still remains some un-reacted and reactive groups (e.g. epoxy group and hydroxyl group), which may blend with other resin, curing agent, other additive, and inorganic powder, and then quickly thermally cured. The optical solid state prepolymer may serve as a major resin composition of the blending process to prepare a thermosetting EMC material of the transfer molding process. Because the major resin of the EMC material has a multi-functional siloxane segment, the EMC material may have an excellent photo and thermal stability over conventional white EMC reflective materials. In addition, the EMC material has an optical property of high transparency. On the other hand, the epoxy resin with the cyclic siloxane structure may reduce excess glue and rough edges due to an overly slow reaction rate of conventional white EMC materials. The composition also improves the processing properties of the fast transfer molding process, the high photo and thermal stability for the optoelectronic packaging material, the mechanical strength of the cured molding material, and the climate resistance of the product.

In one embodiment, the optical solid state prepolymer may further includes 0 to 25 parts by weight of anhydride and 0 to 0.5 parts by weight of catalyst. The anhydride may further accelerate the reaction to form the solid state prepolymer. Too much anhydride will form the crosslinked solid state prepolymer too fast, such that the composition in the back end process is free of the reactivity. For example, the anhydride is a non-aromatic anhydride of solid state or liquid state at room temperature. The solid state non-aromatic anhydride can be tetrahydrophthalic anhydride, hexahydrophthalic anhydride, succinic anhydride, maleic anhydride, or a combination thereof. The liquid state non-aromatic anhydride can be methyl tetrahydrophthalic anhydride, methyl hexahydrophthalic anhydride, or a combination thereof. If the anhydride is aromatic, the product is easily yellowing. The catalyst may further accelerate the reaction rate of the (a) epoxy resin and the (b) oligomeric silsesquioxane. Too much catalyst will form the crosslinked solid state prepolymer too fast, such that the composition in the back end process is free of the reactivity. For example, the catalyst can be zirconium acetylacetonate or aluminum acetylacetonate.

The optical solid state prepolymer can be used in a molding composition. For example, 10 to 50 parts by weight of the optical solid state prepolymer, 3 to 15 parts by weight of solid state non-aromatic anhydride, and 30 to 85 parts by weight of white pigment and inorganic filler can be mixed to form a molding composition. Too little optical solid state prepolymer makes the molding composition fail to uniformly fill the mold (or be easily brittle during demolding). Too much optical solid state prepolymer makes the molding composition have overly low reflectance and insufficient thermal resistance, and be easily yellowing after long-term use. Too little solid state non-aromatic anhydride results in an insufficient crosslinking density of the composition, such that the composition is easily brittle due to insufficient mechanical strength. Too much solid state non-aromatic anhydride may remain too much un-reacted anhydride, such that the composition has an insufficient thermal resistance and is easily yellowing after long-term use. Note that if the non-aromatic anhydride is liquid other than solid, it will not form a solid state composition to perform the transfer molding process. Too little white pigment and inorganic filler results in an overly low reflectance of the molding composition. Too much white pigment and inorganic filler results in an overly high melting viscosity and low flowability of the molding composition during the molding process, such that the molding composition cannot uniformly fill the mold during the back end transfer molding process (or be easily brittle and cracked during the demolding process).

The white pigment and the inorganic filler have a weight ratio of 1:2 to 1:10. Too little inorganic filler makes the composition have an overly high melting viscosity (low flowability) during the molding process, such that the composition cannot uniformly fill the mold in the back end transfer molding process. Too much inorganic filler results in an insufficient reflectance of the composition. For example, the white pigment can be aluminum oxide, titanium oxide, magnesium oxide, zirconium oxide, zinc oxide, or a combination thereof. The inorganic filler can be silicon oxide, aluminum hydroxide, magnesium hydroxide, magnesium carbonate, barium carbonate, or a combination thereof.

In one embodiment, the molding composition further includes 0.2 to 2 parts by weight of a coupling agent and a demolding agent to benefit curing and demolding processes. Too little coupling agent and demolding agent is equal to no addition of them. Too much coupling agent and demolding agent make the molding composition have insufficient mechanical strength (easily brittle) and insufficient thermal resistance, and be easily yellowing after long-term use. For example, the coupling agent can be γ-glycidoxy propyl trimethoxy silane, γ-glycidoxy propyl methyl diethoxy silane, or β-(3,4-epoxycyclohexyl) ethyl trimethoxy silane. The demolding agent can be calcium octadecanoate, fatty acid ester, or fatty ether.

Below, exemplary embodiments will be described in detail so as to be easily realized by a person having ordinary knowledge in the art. The inventive concept may be embodied in various forms without being limited to the exemplary embodiments set forth herein. Descriptions of well-known parts are omitted for clarity.

EXAMPLES

The names, the chemical structures, and the sources of the starting materials in Examples are tabulated in Table 1.

TABLE 1

| Name | Chemical structure/Formula (Major Chemicals) | Molecular weight | Source |
|---|---|---|---|
| SEP-1 | $R^2-\underset{R^2}{\underset{|}{Si}}-O-\underset{R^2}{\underset{|}{Si}}(-O-\underset{R^2}{\underset{|}{Si}}-R^3)_m(-O-\underset{R^2}{\underset{|}{Si}}-R^1)_n$ with $R^1$ termini | Mw = 2,800 to 5,300 | Synthesized in the disclosure |
| SEP-2 | $\begin{array}{c} R^4-Si-O-Si-R^5 \\ | \quad\quad | \\ R^5 \quad\quad R^5 \\ | \quad\quad | \\ R^5-Si-O-Si-R^4 \\ | \quad\quad | \\ O \quad\quad O \\ | \quad\quad | \\ R^5-Si-O-Si-R^4 \\ | \quad\quad | \\ R^4 \quad\quad R^4 \end{array}$ | Mw = 700 to 1100 | Synthesized in the disclosure |
| Silanol-1 | $(R^6{}_3SiO_{1/2})_a(R^7{}_2SiO_{2/2})_b(R^8SiO_{3/2})_c(SiO_{4/2})_d(HO_{1/2})_e$ | Mw = 3,000 to 4,000 | Gelest |
| Silanol-2 | Cage silanol structure with $R^9$ and OH groups | Mw = 700 to 1,200 | Gelest |

TABLE 1-continued
(Major Chemicals)
| Name | Chemical structure/Formula | Molecular weight | Source |
|---|---|---|---|
| Zr-QR | 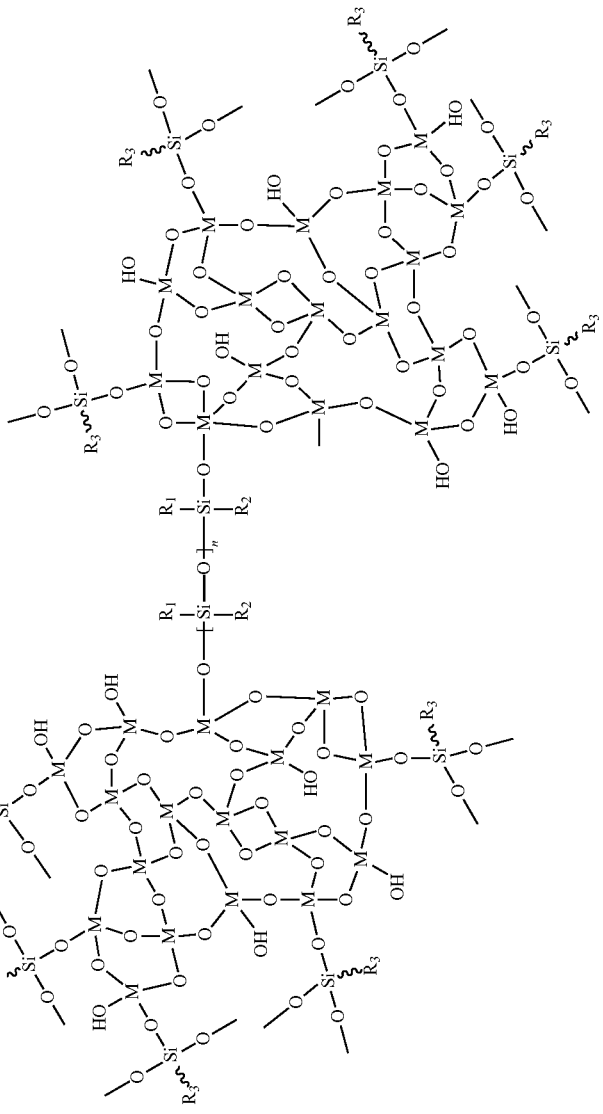 | Mw = 2,800 to 5,000 | U.S. Pat. No. 8,721,919 |
| Zirconium acetylacetonate | 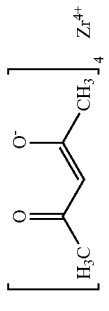 | Mw = 487.6 | Aldrich (Zr-catalyst) |

Synthesis Example 1

SEP-1, Linear Siloxane Epoxy Resin 9.93 g of 4-vinyl-1-cyclohexene-1,2-epoxide, 10 ppm of tris(dibutylsulfide) rhodium trichloride, and 0.0015 g of N,N-dioctadecylmethylamine was added into a two-neck reaction bottle (250 mL). 50 mL of toluene was then added into the reaction bottle, and the mixture in the reaction bottle was stirred and heated to 100° C. Thereafter, 19.5 g of methylhydrosiloxane (HMS-301, commercially available from Gelest) was then dropwise added into the reaction bottle at 100° C. After the HMS-301 was completely added, the stirred mixture was heated to 115° C. The adsorption peak at 2160 cm$^{-1}$ (corresponding to functional group —SiH) of the reaction was checked by FT-IR to ensure that the reaction was completed. After the reaction was completed, the mixture was cooled down to room temperature. Carbon black was then added into the crude and stirred to purify the crude. The carbon black was then filtered out, and the filtrate was concentrated by a rotary evaporator to remove toluene thereof, thereby obtaining a product SEP-1.

Synthesis Example 2

SEP-2, Cyclic Siloxane Epoxy Resin 59.52 g of 4-vinyl-1-cyclohexene-1,2-epoxide, 10 ppm of tris(dibutylsulfide) rhodium trichloride, and 0.0015 g of N,N-dioctadecylmethylamine was added into a two-neck reaction bottle (250 mL). 50 mL of toluene was then added into the reaction bottle, and the mixture in the reaction bottle was stirred and heated to 100° C. Thereafter, 24 g of 1,3,5,7-tetramethylcyclotetrasiloxane (SIT7530, commercially available from Gelest) was then dropwise added into the reaction bottle at 100° C. After the SIT7530 was completely added, the stirred mixture was heated to 115° C. The adsorption peak at 2160 cm$^{-1}$ (corresponding to functional group —SiH) of the reaction was checked by FT-IR to ensure that the reaction was completed. After the reaction was completed, the reaction bottle was cooled down to room temperature. Carbon black was then added into the crude and stirred to purify the crude. The carbon black was then filtered out, and the filtrate was concentrated by a rotary evaporator to remove toluene thereof, thereby obtaining a product SEP-2.

Example A

A combination of Zr-catalyst, silanol-1, silano-2, and hexahydrophthalic anhydride was dissolved in toluene, and then stirred at room temperature for 20 minutes. The SEP-1 and the SEP-2 were evenly mixed, added to the toluene solution, and then stirred at room temperature for 20 minutes. The mixture was stirred at room temperature, and the toluene in the mixture was simultaneously removed by vacuum to form a resin material. The resin material was then heated to a processing temperature and kept at the processing temperature for a period of time, and then cooled for its appearance to be observed (colorless and non-flowable solid). Finally, the prepolymer was aged at 25° C. for a period of time for its appearance to be observed. The reactant amounts, the processing temperature and period of processing, the prepolymer properties, the aging temperature and period of aging, and the prepolymer appearance are listed in Table 2.

Comparative Examples B1, B2, and B5

The silanol-1 (or a combination of the silanol-1 and the silanol-2) was dissolved in toluene and then stirred at room temperature for 20 minutes. The mixture was stirred at room temperature, and the toluene in the mixture was simultaneously removed by vacuum to form a resin material. The resin material was then heated to a processing temperature and kept at the processing temperature for a period of time, and then cooled for its appearance to be observed. The prepolymers in Comparative Examples B-1 and B-5 were non-flowable solid during processing, thereby being not suitable to serve as the EMC. The prepolymer in Comparative Example B-2 was aged at 25° C. for a period of time for its appearance to be observed. The reactant amounts, the processing temperature and period of processing, the prepolymer properties, the aging temperature and period of aging, and the prepolymer appearance are listed in Table 2.

Comparative Example B3

A phenolic curing agent (HRJ1166) was added into a toluene solution of a phenolic epoxy resin (ECN1273), and then stirred at room temperature for 20 minutes. The toluene in the mixture was removed by vacuum to form a resin material. The resin material was then heated to a processing temperature and kept at the processing temperature for a processing period, and then cooled for its appearance to be observed (deep brown and non-flowable). Finally, the prepolymer was aged at 25° C. for a period of time. The reactant amounts, the processing temperature and period of processing, the prepolymer properties, the aging temperature and period of aging, and the prepolymer appearance are listed in Table 2.

Comparative Example B4

The SEP-1 was added into a toluene solution of the Zr-QR and the hexahydrophthalic anhydride, and then stirred at room temperature for 20 minutes. The toluene in the mixture was removed by vacuum to form a resin material. The resin material was then heated to a processing temperature and kept at the processing temperature for a processing period, and then cooled for its appearance to be observed. Finally, the prepolymer was aged at 25° C. for a period of time. The reactant amounts, the processing temperature and period of processing, the prepolymer properties, the aging temperature and period of aging, and the prepolymer appearance are listed in Table 2.

TABLE 2

| Composition/ parts by weight | Example A | | | | | | Comparative Example B | | | | |
|---|---|---|---|---|---|---|---|---|---|---|---|
| | A1 | A2 | A3 | A4 | A5 | A6 | B1 | B2 | B3 | B4 | B5 |
| Silanol-1 | 1 | 5 | 10 | 20 | 15 | | 10 | 10 | | | 35 |
| Silanol-2 | | | | | 5 | 25 | 15 | 15 | | | |

TABLE 2-continued

| Composition/parts by weight | Example A | | | | | | Comparative Example B | | | | |
|---|---|---|---|---|---|---|---|---|---|---|---|
| | A1 | A2 | A3 | A4 | A5 | A6 | B1 | B2 | B3 | B4 | B5 |
| Hexahydrophthalic anhydride | 20 | 10 | 5 | 5 | 5 | | | | | 3.4 | |
| Phenolic curing agent (HRJ1166) | | | | | | | | | 150 | | |
| Zr-QR (Mw = 2800~5000) | | | | | | | | | | 10 | |
| SEP-1 | 50 | 80 | 70 | 70 | 70 | 70 | 10 | 90 | | 100 | 70 |
| SEP-2 | 50 | 20 | 30 | 30 | 30 | 30 | 90 | 10 | | | 30 |
| Phenolic epoxy resin (ECN 1273) | | | | | | | | | 100 | | |
| Zr catalyst | 0.5 | 0.5 | 0.1 | | | | | | | | |
| Processing temperature (° C.) | 70 | 70 | 60 | 60 | 60 | 60 | 60 | 60 | 60 | 90 | 70 |
| Processing period (min) | 240 | 180 | 240 | 300 | 240 | 360 | 360 | 360 | 150 | 140 | 240 |
| Prepolymer optical property | Colorless | Colorless | Colorless | Colorless | Colorless | Colorless | Colorless | Colorless | Deep brown | Colorless | Colorless |
| Melting temperature (° C.) | 110 | 100 | 110 | 120 | 120 | 120 | 120 | 120 | 120 | 110 | 120 |
| Viscosity (mPa · s) | 4600 | 8800 | 9500 | 8800 | 7800 | 8900 | Non flowable | 8600 | 3600 | 5800 | Non flowable |
| Aging temperature (° C.) | 25 | 25 | 25 | 25 | 25 | 25 | — | 25 | 25 | 25 | — |
| Aging period (hr) | 48 | 24 | 24 | 48 | 24 | 24 | — | 24 | 24 | 48 | — |
| Prepolymer appearance at room temperature | Solid | Solid | Solid | Solid | Solid | Solid | Solid | Solid | Solid | Solid | Solid |

Example C

The prepolymer in Example A, a solid anhydride (such as hexahydrophthalic anhydride, tetrahydrophthalic anhydride, or a combination thereof), an inorganic filler, a white pigment, a catalyst, a coupling agent, and an ester of fatty acid type demolding agent were completely stirred and evenly mixed by a mixer to form a molding composition. Thereafter, the molding composition was melted and blended at 80° C. for 15 minutes by a rolling turbine, a kneader, or an extruder. The blend was then cooled, ground to form powder, and then pelletized to obtain a gel cake. The gel cake was used in a transfer molding process, which was flowable at a processing temperature (175° C.) to completely fill into a predetermined mold. After filling the mold, the flowable composition was cooled and then cured in 120 seconds. The reflectance of the cured product to light with a wavelength of 450 nm was measured. The composition types and ratios and processability of the molding composition are listed in Table 3.

Comparative Example D

The prepolymers in Comparative Example B (B2, B3, and B4), hexahydrophthalic anhydride), an inorganic filler, a white pigment, a catalyst, a coupling agent, and an ester of fatty acid type demolding agent were completely stirred and evenly mixed by a mixer to form a molding composition. Thereafter, the molding composition was melted and blended at 80° C. for 15 minutes by a rolling turbine, a kneader, or an extruder. The blend was then cooled, ground to form powder, and then pelletized to obtain a gel cake. The gel cake was used in a transfer molding process, and cooled to be cured. The reflectance of the cured product to light with a wavelength of 450 nm was measured. The composition types and ratios and processability of the molding composition are listed in Table 3.

TABLE 3

| | | Example C | | | | | | | Comparative Example D | | |
|---|---|---|---|---|---|---|---|---|---|---|---|
| | Composition/parts by weight | C1 | C2 | C3 | C4 | C5 | C6 | C7 | D1 | D2 | D3 |
| Curing agent | Hexahydrophthalic anhydride | 37 | 43 | 40 | 45 | 42 | 20 | | 45 | 31 | 45 |
| | Tetrahydrophthalic anhydride | | | | | | 21 | 43 | | | |

TABLE 3-continued

| | Composition/parts by weight | Example C | | | | | | | Comparative Example D | | |
|---|---|---|---|---|---|---|---|---|---|---|---|
| | | C1 | C2 | C3 | C4 | C5 | C6 | C7 | D1 | D2 | D3 |
| Prepolymer | Prepolymer | A1 | A2 | A5 | A3 | A4 | A5 | A6 | B2 | B4 | B3 |
| | Parts by weight | 111.5 | 110.5 | 125 | 115 | 125 | 125 | 120 | 125 | 113.4 | 250 |
| Inorganic filler | Fused spherical $SiO_2$ (D50 = 0.5 μm) | | | | | | 75 | | | | 75 |
| | Fused spherical $SiO_2$ (D50 = 5 μm) | 250 | 300 | 250 | 300 | 250 | 225 | 225 | 250 | 250 | 200 |
| | Fused spherical $SiO_2$ (D50 = 20 μm) | 250 | 275 | 250 | 275 | 300 | 225 | 300 | 275 | 275 | 250 |
| White pigment | Ball-shaped $TiO_2$ (D50 = 0.5 μm) | 100 | 100 | 100 | 100 | 100 | 75 | 100 | 100 | 100 | 100 |
| Coupling agent | Trimethoxy epoxy silane | 8.6 | 8.6 | 8.6 | 8.6 | 8.6 | 9.2 | 8.6 | 8.6 | 8.6 | 9.2 |
| Demolding agent | Hoechst wax E (commercially available from Clariant) | 2.0 | 2.0 | 2.0 | 2.0 | 2.0 | 2.0 | 2.0 | 2.0 | 2.0 | 2.0 |
| Catalyst | PX-4ET | 1.0 | 1.0 | 1.0 | 1.0 | 1.0 | 1.0 | 1.0 | 1.0 | 1.0 | 1.0 |
| Blending condition | Blending temperature (° C.) | 80 | 80 | 80 | 80 | 80 | 80 | 80 | 80 | 80 | 80 |
| | Blending period (min) | 15 | 15 | 15 | 15 | 20 | 20 | 20 | 15 | 20 | 15 |
| Properties | Appearance after blending at room temperature | Solid | Solid | Solid | Solid | Solid | Solid | Solid | Solid | Solid | Solid |
| | Transfer molding processability and demolding ability (175° C.) | ◎ | ◎ | ◎ | ◎ | ◎ | ◎ | ◎ | X | X | ◎ |
| | Reflectance to a light of 450 nm after curing (R %) | 91.6 | 92.2 | 92.3 | 93.5 | 93.2 | 91.7 | 93.8 | — | — | 73 |

\*: The circular mold for transfer molding test had a diameter of 5 cm and a thickness of 3 mm.
◎: Uniformly filled the mold and uniformly demolded,
X: could transfer inject but failed to uniformly fill the mold or uniformly demold.

As described above, all the prepolymers in Example A were suitable to serve as molding composition. In Comparative Example B, some prepolymers were not flowable (e.g. B1 and B5), some prepolymers serving as the molding composition had poor processability (e.g. B2 and B4), and product formed by curing the molding composition including the some prepolymer had an overly low photo reflectance (e.g. B3).

It will be apparent to those skilled in the art that various modifications and variations can be made to the disclosed methods and materials. It is intended that the specification and examples be considered as exemplary only, with the true scope of the disclosure being indicated by the following claims and their equivalents.

What is claimed is:

1. An optical solid state prepolymer, comprising:
a product formed by reacting 100 parts by weight of (a) epoxy resin and 0.1 to 30 parts by weight of (b) oligomeric silsesquioxane,
wherein the (a) epoxy resin includes (a1) linear siloxane epoxy resin and (a2) cyclic siloxane epoxy resin, and the (a1) linear siloxane epoxy resin and (a2) cyclic siloxane epoxy resin have a weight ratio of 1:1 to 5:1.

2. The optical solid state prepolymer as claimed in claim 1, wherein the (a1) linear siloxane epoxy resin has a chemical structure of:

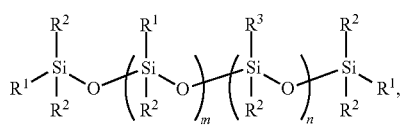

wherein the (a1) linear siloxane epoxy resin has at least two epoxy groups and a weight average molecular weight of 500 to 15000,
wherein m and n have a ratio of 1:10 to 3:1;
$R^1$ is a $C_{1-6}$ alkyl group or an epoxy group,
$R^2$ is a $C_{1-6}$ group, and
$R^3$ is an epoxy group.

3. The optical solid state prepolymer as claimed in claim 1, wherein the (a2) cyclic siloxane epoxy resin has a chemical structure of:

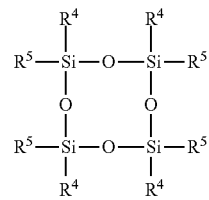

wherein the (a2) cyclic siloxane epoxy resin has a molecular weight of 700 to 1100,
wherein $R^4$ is a $C_{1-6}$ alkyl group, and
$R^5$ is an epoxy group.

4. The optical solid state prepolymer as claimed in claim 1, wherein the (b) oligomeric silsesquioxane has a chemical structure of:
$(R^6{}_3SiO_{1/2})_a(R^7{}_2SiO_{2/2})_b(R^8SiO_{3/2})_c(SiO_{4/2})_d(HO_{1/2})_e$,
wherein the (b) oligomeric silsesquioxane has a weight average molecular weight of 600 to 6000,
wherein $R^6$ is a $C_{1-8}$ alkyl group or a hydroxyl group,
each of $R^7$ and $R^8$ is independently of a $C_{1-8}$ alkyl group,
a is 0 to 10,
b is 0 to 12,
c is 0 to 12, d is 0 to 10, and e is 3 to 18.

5. The optical solid state prepolymer as claimed in claim 1, wherein the (b) oligomeric silsesquioxane has a chemical structure of:

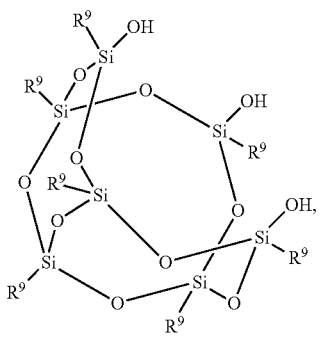

wherein $R^9$ is an alkyl group.

6. The optical solid state prepolymer as claimed in claim 1, further comprising 0 to 25 parts by weight of anhydride and 0 to 0.5 parts by weight of catalyst.

7. The optical solid state prepolymer as claimed in claim 6, wherein the anhydride is a non-aromatic anhydride of solid state or liquid state including succinic anhydride, maleic anhydride, tetrahydrophthalic anhydride, hexahydrophthalic anhydride, methyl tetrahydrophthalic anhydride, methyl hexahydrophthalic anhydride, or a combination thereof.

8. A molding composition, comprising:

10 to 50 parts by weight of the optical solid state prepolymer as claimed in claims 1;

3 to 15 parts by weight of a non-aromatic anhydride of solid state; and 30 to 85 parts by weight of a white pigment and an inorganic filler, wherein the white pigment and the inorganic filler have a weight ratio of 1:2 to 1:10.

9. The molding composition as claimed in claim 8, wherein the white pigment comprises aluminum oxide, titanium oxide, magnesium oxide, zirconium oxide, zinc oxide, or a combination thereof.

10. The molding composition as claimed in claim 8, wherein the inorganic filler comprises silicon oxide, aluminum hydroxide, magnesium hydroxide, magnesium carbonate, barium carbonate, or a combination thereof.

11. The molding composition as claimed in claim 8, further comprising 0.2 to 2 parts by weight of a coupling agent and a demolding agent.

* * * * *